United States Patent [19]

Gould et al.

[11] Patent Number: 5,321,705

[45] Date of Patent: * Jun. 14, 1994

[54] ERROR DETECTION SYSTEM

[75] Inventors: Adam F. Gould, Palatine; Arvind S. Arora, Arlington Heights, both of Ill.

[73] Assignee: Motorola, Inc., Schaumburg, Ill.

[*] Notice: The portion of the term of this patent subsequent to May 12, 2009 has been disclaimed.

[21] Appl. No.: 860,639

[22] Filed: Mar. 30, 1992

Related U.S. Application Data

[63] Continuation-in-part of Ser. No. 616,517, Nov. 21, 1990, Pat. No. 5,113,400.

[51] Int. Cl.⁵ .................... G06F 11/10; H03M 13/12
[52] U.S. Cl. ........................................................ 371/43
[58] Field of Search .................. 371/43, 44, 45, 37.1, 371/38.1, 39.1

[56] References Cited

U.S. PATENT DOCUMENTS

| | | | |
|---|---|---|---|
| 4,633,470 | 12/1986 | Welch | 371/37.1 |
| 4,843,607 | 6/1989 | Tong | 371/37.1 |
| 4,914,660 | 4/1990 | Hirose | 371/37.1 |
| 4,967,413 | 10/1990 | Otani | 371/43 X |
| 5,113,400 | 5/1992 | Gould | 371/43 |
| 5,142,551 | 8/1992 | Borth | 371/43 X |
| 5,144,644 | 9/1992 | Borth | 371/43 X |
| 5,185,747 | 2/1993 | Farahati | 371/43 |

Primary Examiner—Robert W. Beausoliel, Jr.
Assistant Examiner—Glenn Snyder
Attorney, Agent, or Firm—Raymond A. Jenski; Daniel W. Juffernbruch

[57] ABSTRACT

An error detection system for a discrete receiver. Sequences of bits together forming frames of information comprise the signal received by the discrete receiver. The signal is decoded by a convolutional decoder and is re-encoded by an encoder. Successive portions of nonoverlapping sets of adjacently positioned bits of the re-encoded signal formed by the encoder are compared with corresponding bits of a signal representative of the signal received by the receiver. When excessive numbers of the successive portions of the signals which are compared include bit dissimilarities, a bad frame indication is generated.

17 Claims, 7 Drawing Sheets

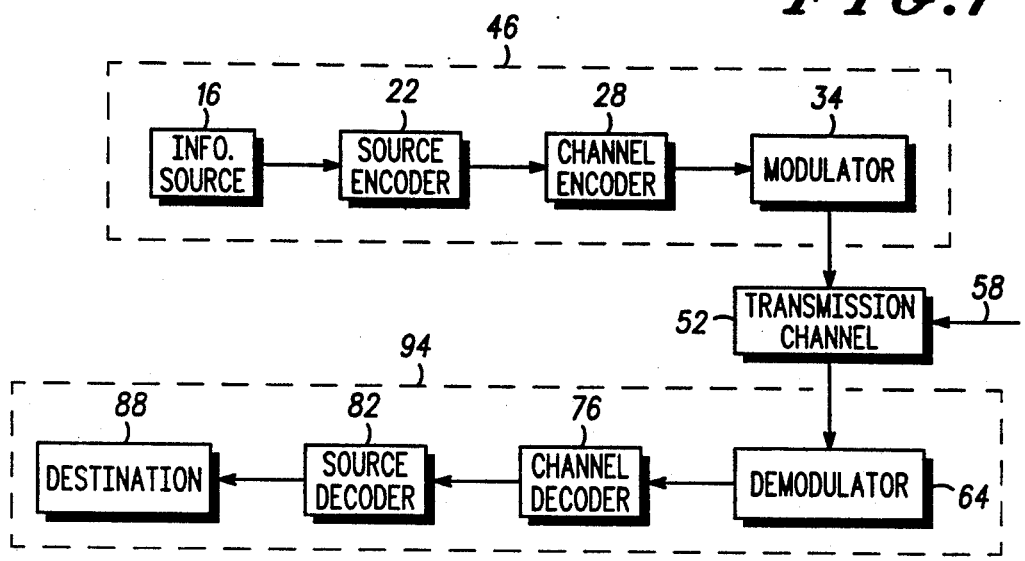
FIG.1
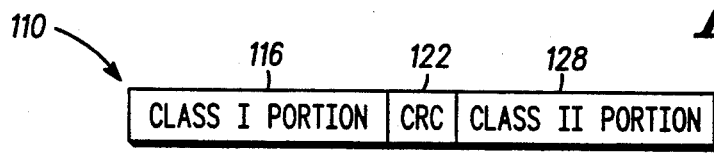
FIG.2-I
FIG.2-II
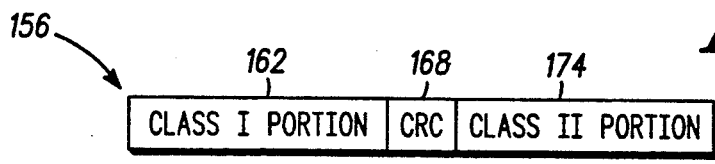
FIG.2-III

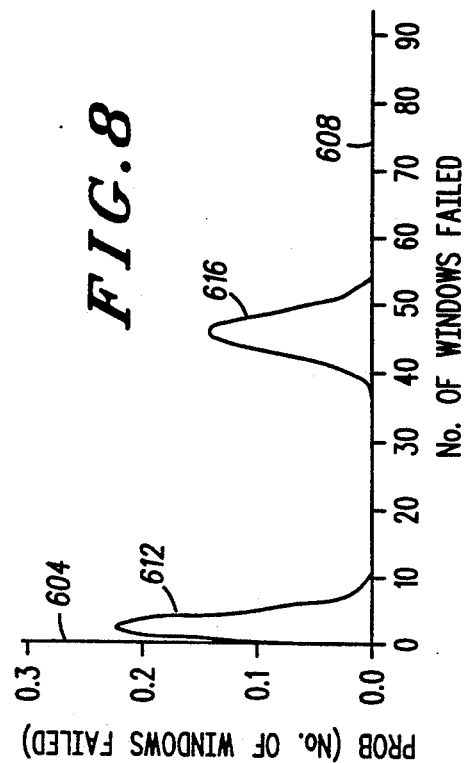
FIG.3
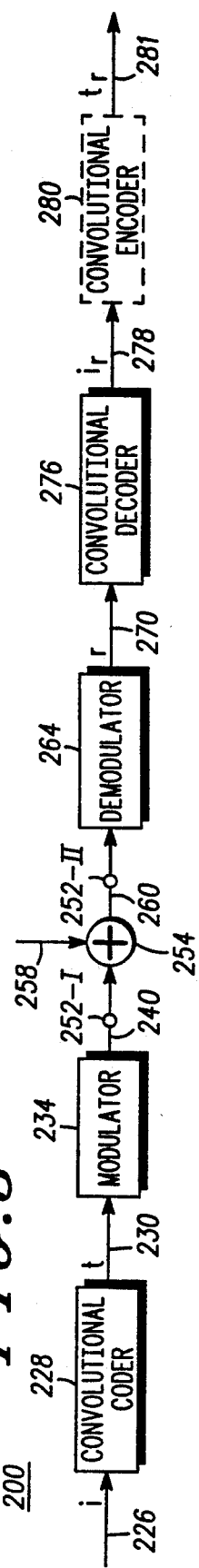
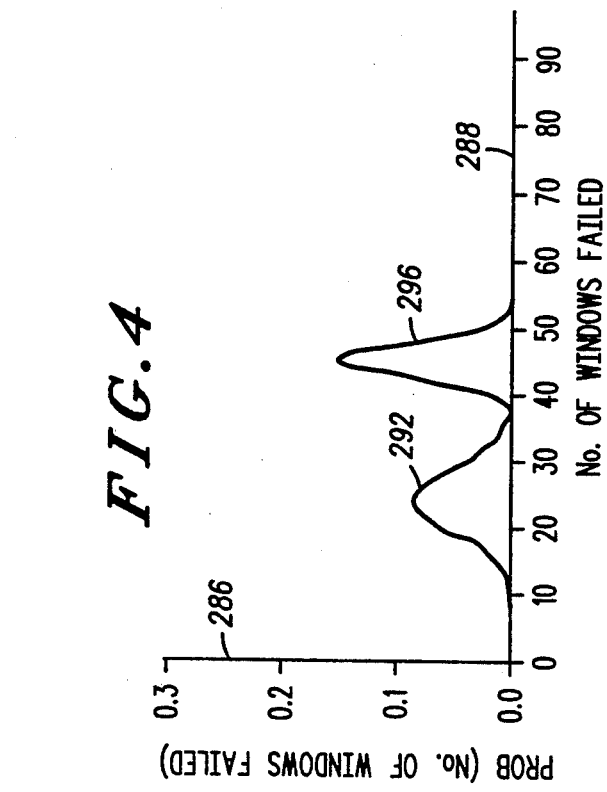
FIG.8
FIG.4

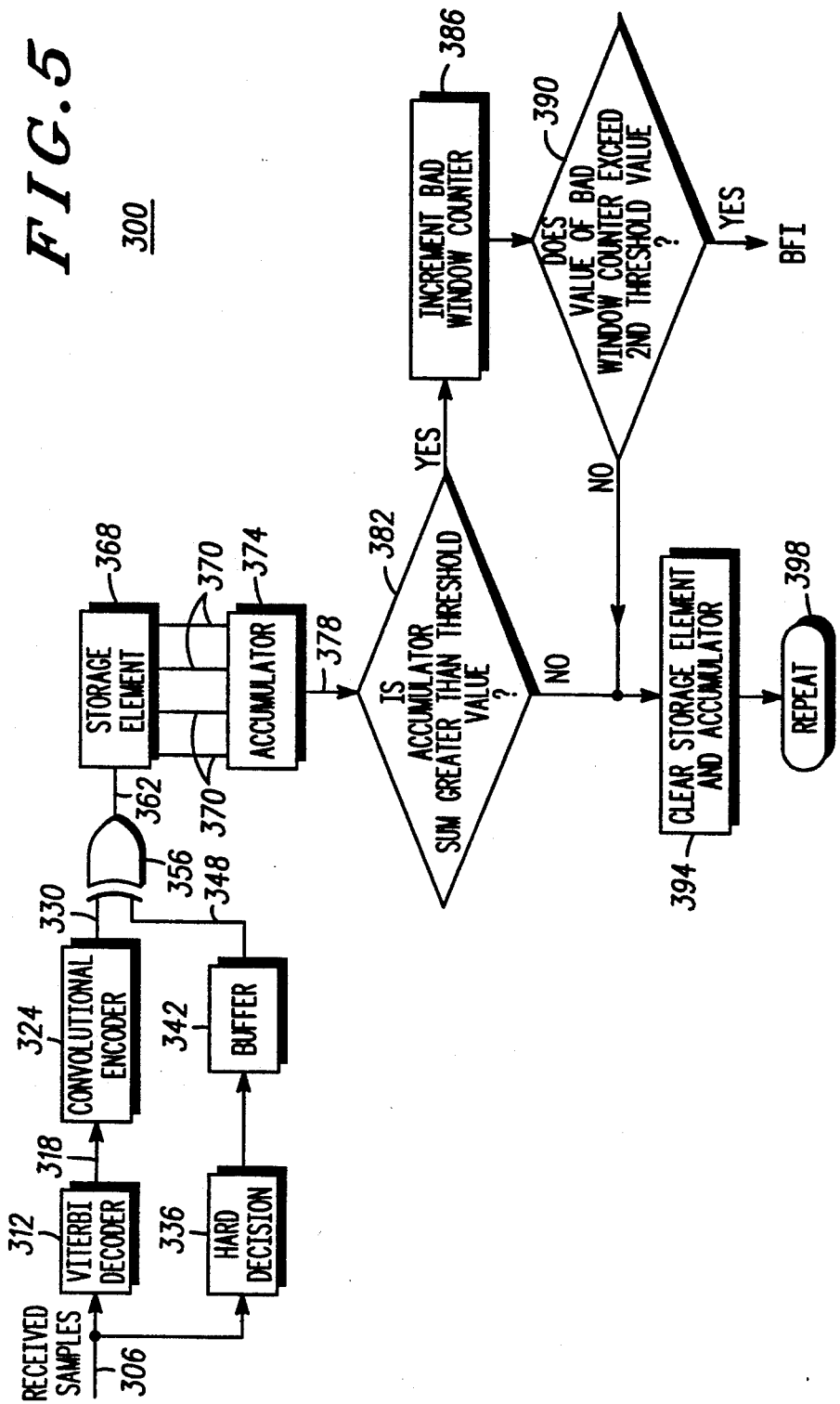

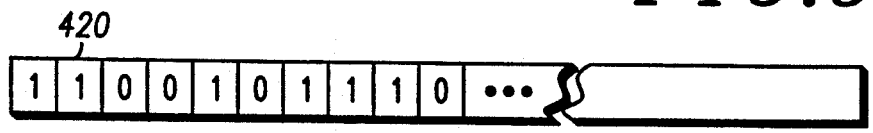
*FIG. 6-I*
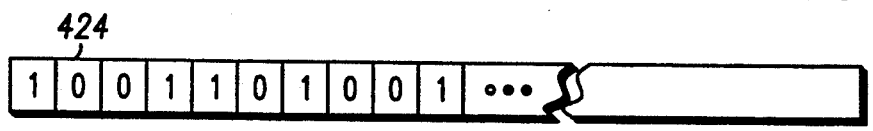
*FIG. 6-II*
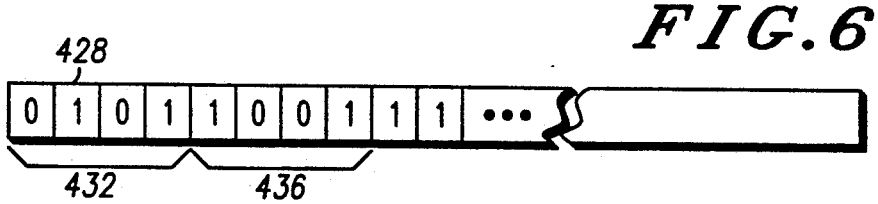
*FIG. 6-III*
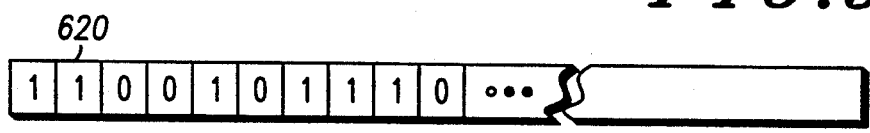
*FIG. 9-I*
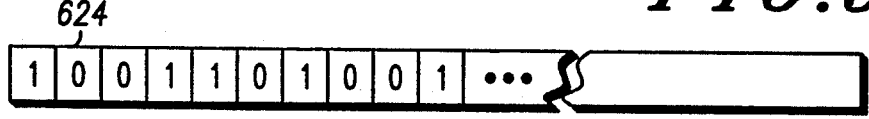
*FIG. 9-II*
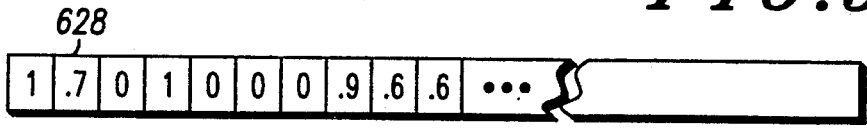
*FIG. 9-III*

ERROR DETECTION SYSTEM

CROSS-REFERENCE TO RELATED APPLICATIONS

This application is a continuation-in-part of application Ser. No. 616,517, filed Nov. 21, 1990, now U.S. Pat. No. 5,113,400, issued on May 12, 1992.

BACKGROUND OF THE INVENTION

The present invention relates generally to error detection systems, and, more particularly, to an error detection system for a radio receiver operative to receive discretely-encoded signals.

A communication system operative to transmit information includes, at minimum, a transmitter and a receiver interconnected by a transmission channel. A radio communication system is a communication system in which the transmission channel is comprised of a radio-frequency channel.

A transmitter which transmits an information signal upon the radio-frequency channel must convert the information signal into a form which may be transmitted upon the radio-frequency channel. The process by which the information signal is converted into a form which may be transmitted upon a radio-frequency channel is referred to as modulation. In a modulation process, the information signal is impressed upon a radio-frequency electromagnetic wave. The characteristic frequency of the radio-frequency electromagnetic wave is of a value which corresponds in frequency to be within a range of frequencies defining the radio-frequency channel. The radio-frequency electromagnetic wave is commonly referred to as a carrier wave, and the carrier wave, once modulated by the information signal, is referred to as a modulated, information signal.

The modulated, information signal occupies a frequency bandwidth comprising a range of frequencies centered at, or close to, the frequency of the carrier wave. The modulated, information signal may be transmitted through free space upon the radio-frequency channel thereby to transmit the information signal between the transmitter and the receiver.

Various techniques have been developed for modulating the information signal upon the carrier wave. Such techniques include amplitude modulation (AM), frequency modulation (FM), phase modulation (PM), and complex modulation (CM). A receiver receives the modulated, information signal transmitted upon the radio-frequency channel, and contains circuitry to detect, or to recreate otherwise, the information signal from the modulated, information signal transmitted thereto. This process is referred to as demodulation. Typically, the receiver contains both demodulation circuitry for demodulating the received signal, and, additionally, down conversion circuitry for converting downward in frequency the radio-frequency, modulated, information signal.

Numerous transmitters may be operative simultaneously to modulate and to transmit information signals over different radio-frequency channels. As long as the signals transmitted by the numerous transmitters are transmitted upon different radio-frequency channels, no overlapping of simultaneously-transmitted signals occur. Receivers positioned to receive the transmitted signals contain tuning circuitry to pass only signals transmitted upon a desired radio-frequency channel.

The electromagnetic frequency spectrum is divided into frequency bands, each of which defines a range of frequencies of the electromagnetic frequency spectrum. The frequency bands are further divided into channels, such channels being referred to hereinabove as radio-frequency channels. Such channels are also frequently referred to as transmission channels. To minimize interference between simultaneously-transmitted signals, transmission of signals upon the channels of certain ones of the frequency bands of the electromagnetic frequency spectrum is regulated.

For instance, in the United States, a portion of a 100 MHz frequency band, extending between 800 MHz and 900 MHz, is allocated for a radiotelephone communication. Portions of corresponding frequency bands are similarly allocated for radiotelephone communications in other geographical areas. Radiotelephone communication may, for example, be effectuated by radiotelephones utilized in a cellular, communication system. Such radiotelephones include circuitry to permit both reception and transmission of modulated, information signals.

A cellular, communication system is formed by the positioning of numerous base stations at spaced-apart locations throughout a geographical area. Each base station contains circuitry to receive modulated, information signals transmitted by radiotelephones, and circuitry to transmit modulated, information signals to the radiotelephones.

Careful selection of the positions at which each of the base stations is located permits at least one base station to be within the transmission range of a radiotelephone positioned at any location throughout the geographical area. Portions of the geographical area proximate to individual ones of the base stations are defined to be associated with the individual ones of the base stations, and a base station and the portion of the geographical area associated therewith are defined to be a "cell". A plurality of cells, each associated with a base station, together form the geographical area encompassed by the cellular, communication system. A radiotelephone positioned within the boundaries of any of the cells of the cellular, communication system may transmit, and receive, modulated, information signals to, and from, at least one base station.

Increased usage of cellular, communication systems has resulted, in many instances, in the full utilization of every transmission channel of the frequency band allocated for cellular, radiotelephone communication. As a result, various ideas have been proposed to utilize more efficiently the frequency band allocated for radiotelephone communications. More efficient utilization of the frequency band allocated for radiotelephone communications increases the transmission capacity of a cellular, communication system.

One such means by which the transmission capacity of the cellular, communication system may be increased is to utilize a digital, or other discrete, modulation technique. When an information signal is converted into discrete form, a single transmission channel may be utilized to transmit, sequentially, more than one information signal. Because more than one information signal may be transmitted upon a single transmission channel, the transmission capacity of an existing frequency band may be increased by a multiple of two or more.

Typically, an information signal is first converted into discrete form (such as, for example, by an analog-to-digital converter), and then encoded by some coding technique prior to modulation and transmission thereof over a transmission channel.

Coding of the signal increases the redundancy of the signal, and such redundancy facilitates accurate determination of the signal once received by a receiver. A radio-frequency channel is not, however, a noise-free transmission channel; therefore, noise, and other transmission difficulties, may cause a receiver to receive a signal other than that which was transmitted by the transmitter. Because an encoded signal contains redundancies, the receiver oftentimes may accurately decode the received signal to determine the actual information signal even when the encoded signal has been distorted during transmission thereof. Various block coding and convolutional coding/decoding techniques have been developed to facilitate accurate recreation of an information signal. One such convolutional coding/decoding technique is a Viterbi coding/decoding technique.

When distortion of the transmitted signal results in the receiver receiving excessive amounts of distorted information, the decoder incorrectly decodes the received signal. Such incorrect decoding of the received signal results in the receiver recreating a signal other than the intended, information signal.

Parity bits oftentimes are included as a portion of the encoded signal transmitted by a transmitter. When a receiver receives the encoded signal having parity bits of values which are different than a predetermined sequence of values, that portion of the signal is ignored by the receiver. However, by random process, the parity bits may be of values indicative of an undistorted signal, and a receiver may incorrectly determine that a distorted signal has been accurately transmitted, and recreate thereby an incorrect signal.

For instance, when a discrete, encoded signal is comprised of sequences of digitally-encoded words (also referred to as frames), parity bits may be interspersed among, or concatenated to the bits which comprise the word or frame. If three parity bits are transmitted with each word or frame, the parity bits may form any of eight combinations. While a receiver must detect a specific combination of values of the parity bits to indicate that a valid signal has been received by the receiver, by random process, an undesired signal, such as a noise-only signal, may have values corresponding to the desired combination of parity bits. When a noise-only signal is received by the receiver, and the receiver searches for three parity bits per word or frame, the receiver may incorrectly determine that an invalid signal is a valid word as often as one out of eight times.

When a base station and radiotelephone communicate in a process referred to as discontinuous transmission (DTX), the base station and radiotelephone transmit information only when information is detected at the radiotelephone. At all other times, the transmitter portion of the radiotelephone is inoperative to conserve radiotelephone power, while the receiver portion of the radiotelephone remains operative to detect reception of valid information. However, when the base station does not transmit information to the radiotelephone (referred to as non-transmit periods), the receiver portion of the radiotelephone receives only noise.

Because, by random process, a noise-only signal may be interpreted by a receiver as valid information one out of eight times when the receiver searches for the values of three parity bits, the receiver incorrectly determines that a noise signal is valid information signal one out of eight times. At a word or frame rate of fifty hertz, a noise-only signal may be incorrectly determined to be a valid information signal by the receiver six times per second. Such incorrect determination by the receiver results in undesired noise levels (sometimes audibly noticeable as squelching to be processed by the receiver).

What is needed, therefore, is a more accurate system by which invalid signals may be rejected by a receiver.

Accordingly, it is important to determine when the received signal contains too much noise (or is a noise-only, or random, signal) to permit proper decoding thereof.

An indication that the received signal contains too much noise to permit such proper decoding thereof may be obtained by determining the frequency, or density, of the number of signal errors contained in the received signal. Utilization of such a technique can, however, provide an indication that a signal of low signal strength cannot properly be decoded. As the signal to noise ratio of a signal of poor signal strength is lower than a corresponding signal to noise ratio of a signal of greater signal strength, such a signal is more susceptible to error as a result of the presence of noise. Such increased susceptibility can result in portions of such signal having an increased density of signal errors. As contrasted to a random (i.e., a noise-only signal) signal, other portions of a weak signal received by a receiver contain useful information. An error detection system operative to reject a signal only responsive to detection of densities of signal errors may thereby reject signals of low signal strength, even though portions of such signals contain useful information.

There is a need, therefore, for an error detection system better able to distinguish between a random, noise-only signal and a signal of low signal strength whereby only the random, noise-only signal is rejected by the error detection system.

SUMMARY OF THE INVENTION

The present invention, accordingly, provides an error detection system, and associated method therefor, for a discrete receiver.

The present invention further advantageously provides a bad frame indicator for a receiver constructed to receive a discretely-encoded signal comprised of coded frames, even when the discretely-encoded signal, when received by the receiver, is of a poor signal strength.

The present invention still further advantageously provides a transceiver constructed to receive a discretely-encoded signal comprised of coded frames of a predetermined number of bits.

The present invention provides further advantages and features, the details of which will become more apparent by reading the detailed description of the preferred embodiments hereinbelow.

In accordance with the present invention, therefore, an error detection system for a receiver constructed to receive a discretely-encoded signal is disclosed. The error detection system is operative to detect when a sequence of discretely-encoded signal received by the receiver is comprised of excessive numbers of invalid signal portions. A soft decision signal representative of the discretely-encoded signal received by the receiver is generated. A decoder decodes the soft decision signal representative of the discretely-encoded signal, and generates a decoded signal responsive to values of the soft decision signal. A coder re-encodes the decoded signal generated by the decoder, and generates a discrete, receiver-encoded signal responsive to values of the decoded signal. A hard decision converter converts the soft decision signal representative of the discretely-encoded signal received by the receiver into a hard decision signal. A comparator compares the discrete, receiver-encoded signal generated by the coder with the hard decision signal and generates a comparison signal indicative of comparisons therebetween. An error signal is generated responsive to times in which the comparison signal indicates that excessive numbers of values of signal portions of a sequence of the hard decision signal differs with values of signal portions of a corresponding sequence of the discrete, receiver-encoded signal.

BRIEF DESCRIPTION OF THE DRAWINGS

The present invention will be better understood when read in light of the accompanying drawings in which:

FIG. 1 is a block diagram of a communication system operable to transmit and to receive discretely-encoded information signals;

FIG. 2-I is a representation of one frame of a digitally-encoded information signal;

FIG. 2-II is a representation of the frame of the digitally-encoded information signal of FIG. 2-I encoded according to a coding technique to form signal redundancies therein;

FIG. 2-III is a representation of the frame of the digitally-encoded information signal received by the receiver and decoded by a decoder according to a decoding technique corresponding to the coding technique used to encode the digitally-encoded information signal;

FIG. 3 is a block diagram of a communication system, analogous to that of FIG. 1, but illustrating mathematical notations of the signals generated by various elements of the communication system;

FIG. 4 is a graphical representation illustrating the relationship between indications of signal errors and probabilities of frequencies of occurrences of such signal errors of a signal of low signal strength, and also of a random signal;

FIG. 5 is a partial functional block, partial flow diagram of the error detection system of a preferred embodiment of the present invention;

FIG. 6-I is a representation of a single frame of an information signal received by a receiver and re-encoded by the error detection system of FIG. 5;

FIG. 6-II is a representation of a single frame of a signal, in encoded form, received by a receiver including the error detection system of FIG. 5;

FIG. 6-III is a representation of a comparison signal generated by a comparison between the signals represented in FIGS. 6-I and 6-II, when utilized to detect the presence of erroneous information according to the error detection system of the present invention;

FIG. 8 is a graphical representation similar with that of FIG. 4, but further illustrating the effects of weighting the signal bit dissimilarities responsive to evaluation of the signal strength of a signal encompassing such signal bits;

FIG. 9-I is a representation of a single frame of an information signal received by a receiver and re-encoded by the error detection system of FIG. 7 of the alternate, preferred embodiment of the present invention;

FIG. 9-II is a representation of a single frame of a signal, in encoded form, received by a receiver of the present invention which includes the error detection system of FIG. 7.

FIG. 9-III is a representation of a comparison signal generated by a comparison between the signal represented in FIGS. 9-I and 9-II, utilized to detect the presence of erroneous information according to the error detection system of the alternate, preferred embodiment of the present invention shown in FIG. 7;

DESCRIPTION OF THE PREFERRED EMBODIMENTS

Figure 7:
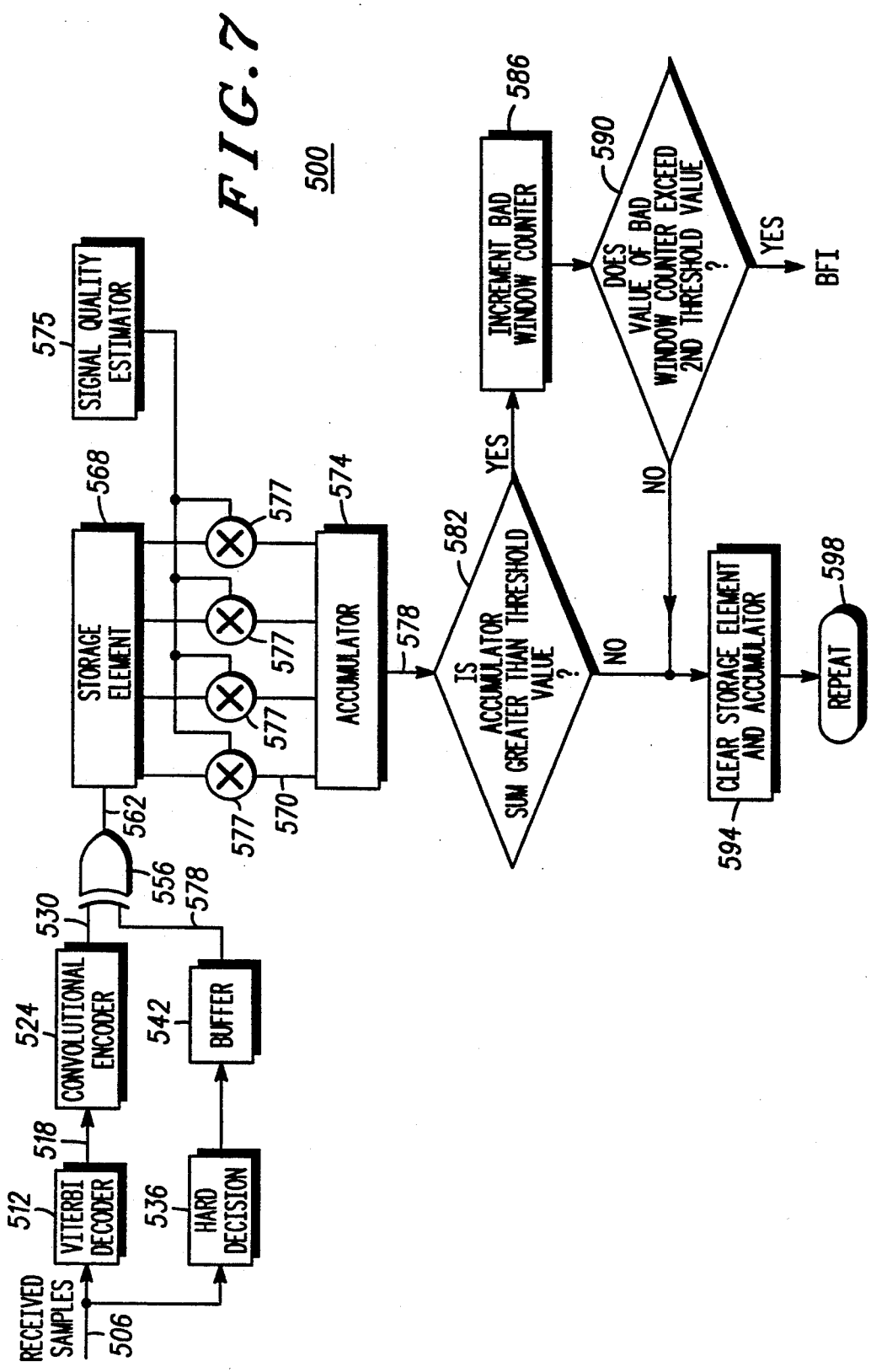
FIG. 7 is a partial functional block, partial flow diagram of the error detection system of an alternate, preferred embodiment of the present invention.

Referring first the block diagram of FIG. 1, a communication system, referred to generally by reference numeral 10, is operable to transmit and to receive discretely-encoded information signals. The error detection system of the preferred embodiments of the present invention forms a portion of a receiver portion of communication system 10, and is operable to detect times when erroneous information is received by such receiver portion.

An information source, here represented by block 16, is representative of the source of an information signal such as, for example, a voice signal. In instances in which information source 16 is comprised of a voice signal, information source 16 additionally includes a transducer for converting the voice signal into electrical form.

The information signal generated by information source 16 is supplied to source encoder 22. Source encoder 22 converts the information signal supplied thereto, which is typically in an analog form, into a discrete signal. Source encoder 22 may, for example, be comprised of an analog-to-digital converter which generates a digital signal thereby.

The discrete signal generated by source encoder 22 is supplied to channel encoder 28. Channel encoder 28 encodes the discrete signal supplied thereto according to a coding technique. Channel encoder 28 may, for example, comprise a block and/or convolutional encoder. Channel encoder 28 functions to convert the discrete signal supplied thereto into an encoded form to increase the redundancy of the discrete signal thereby. By increasing the redundancy of the signal, transmission errors and other signal distortions caused during transmission of a signal are less likely to prevent a receiver portion of communication system 10 from detecting the actual transmitted signal.

The encoded signal generated by channel encoder 28 is supplied to modulator 34. Modulator 34 modulates the encoded information signal supplied thereto according to a modulation technique, such as one of the modulation techniques noted hereinabove. Modulator 34 generates a modulated, information signal.

Information source 16, source encoder 22, channel encoder 28, and modulator 34 together comprise the transmitter portion, referred to by block 46, shown in hatch, of communication system 10.

The modulated, information signal generated by modulator 34 is transmitted upon a transmission channel, here indicated by block 52. Because a transmission channel is not a noise-free channel, noise is applied to the modulated, information signal when the modulated, information signal is transmitted thereupon. The noise signal is indicated in the figure by line 58 applied to transmission channel 52.

The modulated, information signal transmitted upon transmission channel 52 is received by demodulator 64. Demodulator 64 generates a demodulated signal which is supplied to channel decoder 76. Channel decoder 76 corresponds to channel encoder 28 of receiver portion 46, but functions to decode the encoded signal encoded by the block and/or convolutional coder comprising channel encoder 28. Channel decoder 76 generates a decoded signal, in discrete form, which is supplied to source decoder 82. Source decoder 82 converts the discrete signal supplied thereto into a form suitable for application to destination 88. Destination 88 may, for example, comprise an ear piece or speaker portion of a receiver, or another such transducer for converting the electrical signal supplied thereto into human perceptible form.

Demodulator 64, channel decoder 76, source decoder 82, and destination 88 together comprise the receiver portion, indicated by block 94, shown in hatch, of communication system 10.

Turning now to FIG. 2-I, a single frame, referred to generally by reference numeral 110, of a digitally-encoded information signal is represented. Frame 110 comprises a sequence of a predetermined number of bits which together form a codeword forming the encoded signal transmitted by a transmitter to a receiver.

Frame 110 of FIG. 2-I is representative of an encoded signal generated by source encoder 22 of FIG. 1. Frame 110 of FIG. 2-I forms a codeword of 260 digital bits in length. As illustrated, frame 110 is comprised of class one portion 116 of one hundred seventy-nine bits, parity bit portion 122 (alternately referred to by the term cyclic redundancy check, or CRC, portion) of a length of three bits, and class two bit portion 128 of seventy-eight bits in length. Other frame lengths and configurations, are, of course, possible; frame 110 of FIG. 2-I is indicative of but one possible frame comprised of digitally-encoded bits.

FIG. 2-II is a representation of a single frame 134 in which the class one bit portion 116 has been encoded according to a coding technique, such as the Viterbi coding technique of a Viterbi convolutional coder. The class one bit portion 140 of frame 134 of FIG. 2-II is of length of three hundred seventy-eight bits, and is representative of a signal generated by channel encoder 28 of transmitter 46 of the communication system 10 of FIG. 1. Parity bit portion 146 (i.e., CRC portion 146), similar to class one bit portion 116, is also encoded, and is of an increased number of bits relative to class two bit portion 128 of frame 110 of FIG. 2-I. Class one bit portion 140 and parity bit portion 146 are of increased bit lengths relative to bit portions 116 and 122 of frame 110 to increase thereby the redundancy of the bit portions, thereby to reduce the possibility that distortion of the frame 134 during transmission thereof would prevent accurate recreation of the actual information signal comprising bit portions 116 and 122 of frame 110.

Greater, or smaller, portions of a frame may be encoded by a conventional coding technique, as desired.

FIG. 2-III is a representation of frame 156 indicative of a frame received and decoded by a decoder portion of a receiver such as receiver portion 94 of FIG. 1. Frame 156 is comprised of class one bit portion 162, parity bit (i.e., CRC) portion 168, and class two bit portion 174. Ideally, frame 156 of FIG. 2-III is identical to frame 110 of FIG. 2-I. However, as described hereinabove, because the transmission channel (indicated in FIG. 1 by block 52) is not a noise-free signal, distortion of the signal occurring during transmission thereof may cause one, or many bits of portions 162, 168 and 174 to differ from corresponding portions 116, 122, and 128 of frame 110.

Use of a coding technique, here a convolutional coding technique, such as a Viterbi, convolutional coding technique, reduces the possibility that distortion of class one bit portion 140 occurring during transmission thereof would prevent accurate recreation of the actual class one bit portion 116 of frame 110. However, as is known, when distortion causes changes in the values of bits in too great of a density of at least a portion of bit portion 140 of frame 134, decoding of the received signal does not recreate the actual, information signal of bit portion 116 of frame 110, but, rather, generates an incorrect information signal.

As previously mentioned, by random process, distortion of the values of parity bits during transmission may actually provide a positive indication (although an incorrect positive indication) that the transmitted signal was transmitted in undistorted form. Such incorrect indication of an undistorted signal permits invalid information to be considered to be an undistorted, transmitted signal.

FIG. 3 is a block diagram of a portion of a communication system, here referred to generally by reference numeral 200, and includes elements which are analogous to corresponding portions of communication system 10 of FIG. 1. The signals generated by respective ones of the blocks comprising the illustrated portion of communication system 200 are represented by mathematical notations.

For instance, encoded bits, i, are supplied on line 226 to convolutional coder 228. Convolutional coder 228 is analogous to channel encoder 28 of FIG. 1 and is operative to introduce redundancies upon the signal supplied thereto. Convolutional coder 228 generates an encoded signal, t, on line 230 which is supplied to modulator 234. Modulator 234 is analogous to modulator 34 of FIG. 1 and is operative to modulate the encoded signal applied thereto according to a modulation technique.

Modulator 234 generates a modulated signal on line 240 upon a transmission channel which is represented in the figure by portions of the figure extending between terminals 252-I and 252-II. Summing element 254 is positioned to receive the signal generated by modulator 234 on line 240 and also receives, as an input, a noise component on line 258. Summing element 254 generates a summed signal on line 260 comprised of both an information component and a noise component.

The signal generated on line 260 is applied to demodulator 264 which, analogous to demodulator 64 of FIG. 1, is operative to demodulate the signal received thereat. Demodulator 264 is analogous to demodulator 64 of communication system 10 of FIG. 1. Demodulator 264 generates sequences of received bits, r, on line 270 which are applied to convolutional decoder 276.

Convolutional decoder 276 is analogous to channel decoder 76 of FIG. 1, and is operative to remove the redundancies introduced upon the information signal, i, by convolutional coder 228. Accordingly, convolutional decoder 276 generates sequences of information bits, designated in the figure by $i_r$, on line 278, which, ideally, are identical to the sequence i applied to convolutional coder 228 on line 226. When the information component of the signal generated on line 260 (i.e., the portion of the signal formed of the modulated signal supplied to summer 240) is of a strong signal value (i.e., a signal of a large magnitude), and the noise component is of a small signal value, convolutional decoder 276 generates the sequence $i_r$ which is quite similar to that of the sequence i supplied to coder 228. However, when the signal generated on line 260 is of a small signal value, or when the noise component supplied on line 258 is of a large signal value relative to the signal value of the modulated signal (that is, when the signal-to-noise ratio is small), decoding errors by decoder 276 result in a signal $i_r$ which may be dissimilar with that of i. And, when the signal level of the noise component is substantially larger than the signal level of the modulated signal (such that the signal generated on line 260 approaches a random signal), the signal $i_r$ is wholly dissimilar with that of i.

When signal $i_r$ is wholly dissimilar with that of i, such signal should be ignored as the decoded signal $i_r$ is not representative of the signal i encoded by coder 228 and transmitted by the transmitter portion of communication system 200. When the signal-to-noise ratio of the signal generated on line 260 is small, the likelihood that the signal $i_r$ is an accurate representation of i is somewhat suspect, and when the signal-to-noise ratio of the signal generated on line 260 is large, the signal $i_r$ is quite likely to be similar with that of i.

The block diagram of communication system 200 of FIG. 3 further illustrates block 280, shown in hatch, representative of a convolutional encoder. As will be noted hereinbelow, a convolutional encoder, such as convolutional encoder 280, forms a portion of the preferred embodiments of the present invention, and is coupled to receive the signal, $i_r$, generated by convolutional decoder 276. Convolutional encoder 280 is operative to encode the signal supplied thereto according to a convolutional encoding technique to generate an encoded signal $t_r$. The convolutional encoding technique utilized by encoder 280 is the same convolutional encoding technique utilized by convolutional coder 228. When the signal i is substantially identical to signal $i_r$, the signal $t_r$ will be substantially identical with that of signal t generated by coder 228, which, in turn, in the absence of large noise signal levels, should also be substantially similar to the signal r generated by demodulator 264 on line 270. Hence, a comparison of $t_r$ and r provides an indication of the quality of the decoding by decoder 276 to produce a signal $i_r$ substantially similar to signal i supplied to coder 228.

FIG. 4 is a graphical representation showing the probability of occurrence of signal dissimilarities between signal $t_r$ and r. The probability of such occurrence is plotted on ordinate axis 286 as a function of signal dissimilarities plotted on abscissa axis 288.

Abscissa axis 288 is scaled in terms of numbers of groups of sequentially-positioned bits, referred to hereinafter as "windows" of bits of a frame comprised of a sequence of bits (such as frame 134 of FIG. 2-II), which have greater than a certain number of bit dissimilarities. For instance, a window may be (and, in the preferred embodiment, is) defined to be four sequentially-positioned bits. (Frame 134 of FIG. 2-II formed of three hundred seventy-eight bits is comprised of ninety-four and one half windows.) And a window failure is defined to be instances in which at least one bit of the window of bits of signals $t_r$ and r are dissimilar.

Curve 292 is a statistical distribution illustrating the probability of frequency of occurrence of signal errors of a received signal of a small signal strength. Curve 296 is a statistical distribution illustrating the probability of frequency of occurrence of signal errors of a random signal, such as a noise-only signal, received by a receiver. It is noted that the probability of occurrence of signal errors of a signal of small signal strength is small relative to corresponding probabilities of occurrence of signal errors of the random, or noise-only signal.

Accordingly, an error detection system for detecting those times in which a receiver should ignore certain portions of a signal received thereat, by distinguishing between a random (i.e., noise-only signal) signal and a signal of small signal strengths can reduce the likelihood of an erroneous decision to disregard portions of a signal of small signal strength.

Turning next to the partial block, partial flow diagram of FIG. 5, the error detection system, referred to generally in the figure by reference numeral 300, of the present invention is shown. Error detection system 300 is operative to receive at least samples of the transmitted signal received by a receiver. The received signal received by a receiver is supplied on line 306 to Viterbi decoder 312. (The signal supplied on line 306 of system 300 is analogous to signal r supplied on line 270 to decoder 276 of FIG. 3.) The signal supplied to Viterbi decoder 312 is utilized as a soft decision signal.

Viterbi decoder 312 generates a decoded signal on line 318 which is supplied to convolutional encoder 324. (The signal generated on line 318 of system 300 is analogous to signal i generated on line 278 of communication system 200 of FIG. 3.)

Convolutional encoder 324 generates an encoded signal on line 330 which, in the absence of significant amounts of distortion of the signal transmitted to the receiver, is identical to the signal supplied to decoder 312 on line 306. (The signal generated on line 330 is analogous to signal $t_r$ generated on line 281 of communication system 200 of FIG. 3.)

However, when excessive numbers of portions of the signal are distorted during transmission thereof as a result of noise introduced upon the signal, decoder 312 generates a signal on line 318 which is wholly dissimilar with the signal actually generated by a transmitter. Hence, the re-encoded signal generated on line 330 (which is not susceptible to distortions caused by noise on the transmission channel) also differs with that of the signal supplied to decoder 312 on line 306.

Line 306 is coupled to hard decision block 336 whereat the signal supplied on line 306 is converted into a series of digital pulses which are stored in buffer 342. Buffer 342 is here preferably of a capacity at least as great as the length of a transmitted frame, such as frame 134 of FIG. 2-II. Buffer 342 provides an output on line 348 to allow the contents of buffer 342 to be suppled sequentially to logical exclusive-OR gate 356.

The re-encoded signal generated on line 330 is additionally supplied to the logical exclusive-OR gate 356. While gate 356 is comprised of an exclusive-OR gate, and the following description describes operation of the invention in terms of such, it is to be noted that other logic gates, and logical systems may alternately be utilized.

Gate 356 is operative to determine when the re-encoded signal generated by encoder 324 on line 330 differs from the signal supplied on line 306. (Using the notation of FIG. 3, gate 356 is operative to compare signals r and $t_r$.) Exclusive-OR gate 356 generates a comparison signal on line 362, and the comparison signal is supplied to storage element 368.

Storage element 368 is operative to store groups of bits comprising the comparison signals generated on line 362. In a preferred embodiment of the present invention, storage element 368 is operative to store sequences of four bits, the length of a "window" of bits as defined hereinabove, of the comparison signal generated on line 362. Four bits of the comparison signal are stored in storage element 368, then analyzed, as will be noted hereinbelow, and then succeeding groups of bits of the comparison signal are stored in the storage element, and the process is repeated.

More particularly, in the preferred embodiment, the windows are comprised of nonoverlapping, adjacent sequences of bits of the comparison signal generated on line 362.

The values of the individual bits of the window of bits are of values corresponding to the comparison between the signals supplied to gate 356 on lines 330 and 348, respectively. As, in the preferred embodiment, gate 256 is an exclusive-OR gate, dissimilarities between bits supplied on lines 330 and 348 to gate 356 cause gate 356 to generate a bit value of a logical one responsive to such comparisons, and values of logical zeroes otherwise.

The values of the bits comprising the window stored in storage element are supplied by way of lines 370 to accumulator 374. As storage element 368 of the preferred embodiment stores four bits at a time therein, four lines 370 interconnect storage element 368 and accumulator 374. It is to be understood, of course, that storage elements of other embodiments operative to store other numbers of bits simultaneously therein may be similarly coupled to accumulator 374 to supply the contents of the respective memory locations of storage element 368 to accumulator 374.

Here, accumulator 374 is operative to count the number of signal bits of the window of signal bits stored in storage element 368 which are of logical one values.

A signal representative of such count is generated on line 378, and is utilized to determine when excessive numbers of signal dissimilarities, here logical ones, are noted in excessive numbers of windows of signal bits of the comparison signal.

The count of signal bit dissimilarities accumulated by accumulator 374 is utilized at decision block 382 whereat a determination is made whether the number of signal bit dissimilarities, i.e., the sum of accumulator 374, is greater than a bit dissimilarity threshold value. In a preferred embodiment, the threshold value is a count of one, and decision block 382 determines whether a single bit dissimilarity determination is amongst the window of signal bits stored in storage element 368.

If the accumulator sum is greater than the threshold value, the yes branch is taken from decision block 382 to block 386 whereat a bad window counter is incremented. (The bad window counter is initially set at zero.) Then, a determination is made, as indicated by decision block 390, whether the value of the bad window counter exceeds a bad window threshold value. If the bad window counter is of a value which exceeds this threshold value, the yes branch is taken from decision block 390 and a bad frame indication is generated. Otherwise the no branch is taken from decision block 390. In a preferred embodiment, the bad window threshold value is of a value of thirty-nine. Only when thirty-nine windows have at least one bit dissimilarity is a bad frame indicated to cause the yes branch to be taken from decision block 390.

If the no branch is taken from either decision block 382 or 390, the contents of storage element 368 and accumulator 374 are cleared, and the process is repeated, as indicated by block 398. As a result, successive sequences of signal bits, that is, windows, of the comparison signal generated on line 362 are stored in storage element 368 and the number of signal bit dissimilarities of each of the successive windows of signal bits are tested to determine the number of signal bit dissimilarities of the signal bits thereof.

When a bad frame is indicated, a receiver incorporating such an error detection system ignores the entire frame of information as too many signal bit errors are present in that frame of information for the frame to be properly decoded to reproduce the actual, transmitted signal.

FIG. 6-I is a representation of a single frame 420 of a typical information signal received and re-encoded by the convolutional encoder 324 of error detection system 300 of FIG. 5. (With reference again to the notation of communication system 200 of FIG. 3, frame 420 is representative of a frame of signal t.) For purposes of illustration, values of several of the bits of which the frame is comprised are indicated in the figure. Frame 420 corresponds to the re-encoded signal supplied on line 330 to gate 356 of FIG. 5.

FIG. 6-II is a representation, similar to that of the representation of FIG. 6-I, but representative of a single frame 424 of an encoded signal received by a receiver and supplied to gate 356 on line 348. (With reference again to the notation of communication system 200 of FIG. 3, frame 420 is representative of a frame of signal r, after appropriate conversion into a hard decision signal.) Similar to frame 420 of FIG. 6-I, for purposes of illustration, values of selected ones of the bits of which frame 424 is comprised are indicated in the figure. It is to be noted that the values assigned to the bit locations are for purposes of illustration.

FIG. 6-III is a representation of a single frame, here frame 428, of a comparison signal generated on line 362 of FIG. 5 resulting from a comparison of frame 420 and 424 of FIGS. 6-I and 6-II, respectively. (With reference again to the notation of FIG. 3, frame 428 is representative of a comparison between signal $t_r$ and r.) It may be discerned that when a bit of frame 420 is of the same value as that of a corresponding bit of frame 424, the corresponding bit of frame 428 is a value of a logical zero. When the value of a bit of frame 420 is dissimilar with that of a corresponding bit of frame 424, the corresponding bit of frame 428 is a value of a logical one.

As mentioned previously, because a coder-decoder of a transmitter/receiver is operative to minimize the effects of distortion caused during transmission of an information signal between a transmitter and a receiver, a decoder, such as Viterbi decoder 312 of FIG. 5, facilitates accurate decoding of a actual, received signal into a signal corresponding to an actual, transmitted signal transmitted by a transmitter.

However, when a signal received by Viterbi decoder 312 differs too greatly from an actual, transmitted signal, the decoder 312 incorrectly decodes the received frame. In such instances, a greater number of dissimilarities in value of the signal supplied to gate 356 on lines 330 and 348 are generated.

By determining the number of dissimilarities at selected portions of frame 428 of the comparison signal generated on line 362, an indication of when the decoder 312 improperly decodes an actual transmitted signal may be determined. It is noted that rather then merely determining the total number of dissimilarities in value between frames 420 and 424, the frame is divided into windows, or groups of sequentially-positioned signal bits wherein the number of signal bit dissimilarities in each window, or group, of signal bits is ascertained. Only when an excessive number of windows of a frame includes a certain number of bit dissimilarities is a bad frame indication generated.

The windows are defined as adjacently-positioned, nonoverlapping groups of signal bits of a frame of signal bits. Two of such windows are indicated in the figure by brackets 432 and 436. If an excessive number of windows have an excessive number of signal bit dissimilarities, a bad frame indication is generated. As mentioned previously, in a preferred embodiment, only when thirty-nine windows have excessive numbers of bit dissimilarities is a bad frame indication generated. When a bad frame indication is generated, the entire frame of signal bits is ignored by the receiver. As successive windows of the frame of signal bits of a comparison signal generated by gate 356 are stored in storage element 368, accumulator 374 determines the number of signal bit dissimilarities in the successive ones of the windows stored in the storage element. A count is maintained of the number of windows having greater than a threshold value of signal bit dissimilarities, and when a certain number of windows of signal bits of the frame of signal bits includes greater than the threshold number of signal bit dissimilarities, the frame is ignored by the receiver.

FIG. 7 is a partial functional block, partial flow diagram of the error detection system, referred to generally by reference numeral 500, of an alternate, preferred embodiment of the present invention. Error detection system 500 is operative to receive at least samples of the transmitted signal received by a receiver. A signal representative of the signal received by a receiver is supplied on line 506 to Viterbi decoder 512. (The signal supplied on line 306 of system 300 is analogous to signal r supplied on line 270 to decoder 276 of communication system 200 of FIG. 3.)

The signal supplied to Viterbi decoder 512 is utilized as a soft decision signal. Viterbi decoder 512 generates a decoded signal on line 518 which is supplied to convolutional encoder 524. (The signal generated on line 318 of system 300 is analogous to signal $i_r$ generated on line 278 of communication system 200 of FIG. 3.)

Convolutional encoder 524 generates an encoded signal on line 530 which, in the absence of significant amounts of distortion of the signal transmitted to the receiver, is identical to the signal supplied to decoder 512 on line 506. (The signal generated on line 530 is analogous to signal t generated on line 281 of communication system 200 of FIG. 3.)

However, as mentioned previously, when portions of the signal are distorted in excessive amounts during transmission thereof as a result of noise introduced upon the signal, decoder 512 generates a signal on line 318 which is wholly dissimilar with the signal actually generated by a transmitter. Hence, the re-encoded signal generated on line 530 (which is not susceptible to distortions caused by noise on the transmission channel) also differs with that of the signal supplied to decoder 512 on line 506.

Line 506 is coupled to hard decision block 536 whereat the signal supplied on line 506 is converted into a series of digital pulses which are stored in buffer 542. Buffer 542 is preferably of capacity at least as great as the length of a transmitted frame, such as frame 134 of FIG. 2-I. Buffer 542 provides an output on line 548 to allow the contents of buffer 542 to be supplied to logical exclusive-OR gate 556. The re-encoded signal generated on line 530 is additionally supplied to the logical exclusive-OR gate 556. While gate 556 is comprised of an exclusive-OR gate, other types of logic gates may be alternately utilized, as appropriate.

Gate 556 is operative to determine when the re-encoded signal generated by encoder 524 on line 530 differs from the signal supplied on line 506. (And using the notation of FIG. 3, gate 356 is operative to compare signals r and $t_r$.) Gate 556 generates a comparison signal on line 562, and the comparison signal is supplied, in serial fashion, to storage element 568. Similar to storage element 368 of the error detection system 300 of FIG. 5, storage element 568 preferably is operative to store windows formed of successive, nonoverlapping, adjacent groups of four signal bits of the comparison signal generated on line 562.

Again, the contents comprising the windows of signal portions stored in storage locations of storage elements 568 are supplied by way of lines 570 to accumulator 574. However, in this embodiment, the contents of the memory location of storage element 568 are first weighted by a signal quality value generated by signal quality estimator 575 which weights the values of each of the signal bits of the window of signal bits stored in storage element 568. Mixer 577 positioned in line between storage element 568 and accumulator 574 on lines 570 represent such weighting of the contents on the memory location.

When the signal value of the signal bit of the comparison signal is of a value of a logical zero, the weighting effect of the signal quality value does not alter the value of the logical zero; however, when the signal value of the signal bit of the comparison signal stored in storage element 568 is of a value of a logical one, the value of the signal quality value weights the value of the signal bit such that accumulator 574 stores a value resulting in a value of the accumulator which is not necessarily merely a logical value of one (or a multiple thereof). A count of weighted bit dissimilarities is thereby stored in the accumulator.

A signal representative of the count stored in accumulator 574 is generated on line 578. The count maintained by accumulator 574 is utilized to determine whether the contents thereof are greater than a threshold value, as indicated by the decision block 582. When the accumulator count is greater than a bit dissimilarity threshold value, the yes branch is taken therefrom, and a bad window counter is incremented, as indicated by block 586.

When a determination is made, and as indicated by decision block 590, that the bad window counter exceeds a bad window threshold value, the yes branch is taken therefrom, and a bad frame indication is generated.

When the threshold values are not exceeded at decision blocks 582 and 590, respectively, the no branches are taken from the respective decision blocks, and the storage element 568 and accumulator 574 contents are cleared. A succeeding window of signal bits of the comparison signal generated on line 562 are stored in storage element 568. Thereafter, and as indicated by block 598, process is repeated.

Operation of error detection system 500 is similar with that of error detection system 300 of FIG. 5, and will not again be described in detail. However, as the values of the signal bit dissimilarities of successive ones of the windows of signal bits are weighted by a signal quality value generated by a signal quality estimator, a determination may be made with more precision as to whether or not the signal bits of the window of signal bits stored in storage element 568 contain successive numbers of signal bit dissimilarities. In effect, a confidence level is associated with the signal bit dissimilarities dependent upon the value of the signal quality value. And, when the signal quality value is representative of the signal strength of the signal received by a receiver incorporating system 500, the confidence level associated with the signal bit dissimilarities is representative of such signal strength.

For instance, when the signal quality value generated by signal quality estimator 575 indicates that a weak signal is received by the receiver, the signal bit dissimilarities may be given greater weight to make more likely the probability that the accumulator sum will be greater than the first threshold value. Conversely, when the signal quality value generated by signal quality estimator 575 indicates that a strong signal is received by the receiver, the signal bit dissimilarities may be given lesser weight to make less likely that the accumulators sum stored by accumulator 574 will be greater than the first threshold value to cause an indication of a bad window. Again, only when excessive numbers of windows having greater than the bit dissimilarity threshold number of bit dissimilarities is a bad frame indication generated.

FIG. 8 is a graphical representation, similar with that of FIG. 4, but illustrating the relationship between the frequency of occurrence of bit dissimilarities of a signal of low signal strength and a random signal (i.e., a noise-only signal) when a bad window is determined after weighting the bit dissimilarities by a signal quality value. Ordinate axis 604 is scaled in terms of frequency of occurrences and abscissa axis 608 is scaled in terms of number of bad windows in a manner similar to that described with respect to the graphical representation of FIG. 4. Curve 612 is a distribution of the frequency of occurrences of bad windows defined according to this method, and curve 616 is a distribution of the frequency of occurrences of such bad windows according to this method. As there is little overlap between curve 612 and 616, the likelihood of erroneously defining a signal of small signal strength as a random signal is even less than that described with respect to the graphical representation of FIG. 4 and the error detection system of FIG. 5.

FIG. 9-I is a representation of a single frame 620 of a typical information signal received and re-encoded by the convolutional encoder 524 of error detection system 500 of FIG. 7. (With reference again to the notation of communication system 200 of FIG. 3, frame 620 is representative of a frame of signal t.) For purposes of illustration, values of several of the bits of which the frame is comprised are indicated in the figure. Frame 620 corresponds to the re-encoded signal supplied on line 530 to gate 556 of FIG. 7.

FIG. 9-II is a representation, similar to that of the representation of FIG. 9-I, but representative of a single frame 624 of an encoded signal received by a receiver and supplied to gate 556 on line 548. (With reference again to the notation of communication system 200 of FIG. 3, frame 624 is representative of a frame of signal r, after appropriate conversion into a hard decision signal.) Similar to frame 620 of FIG. 9-I, for purposes of illustration, values of selected ones of the bits of which frame 624 is comprised are indicated in the figure. It is to be noted that the values assigned to the bit locations are for purposes of illustration.

FIG. 9-III is a representation of a single frame, here frame 628, of a comparison signal generated on line 562 of FIG. 7 resulting from a comparison of frame 620 and 624 of FIGS. 9-I and 9-II, respectively. (With reference again to the notation of FIG. 3, frame 628 is representative of a comparison between signal $t_r$ and r.) It may be discerned that when a bit of frame 620 is of the same value as that of a corresponding bit of frame 624, the corresponding bit of frame 428 is a value of a logical zero. When the value of a bit of frame 420 is dissimilar with that of a corresponding bit of frame 624, the corresponding bit of frame 628 is a value of a logical one weighted by the signal quality value.

Figure 10:
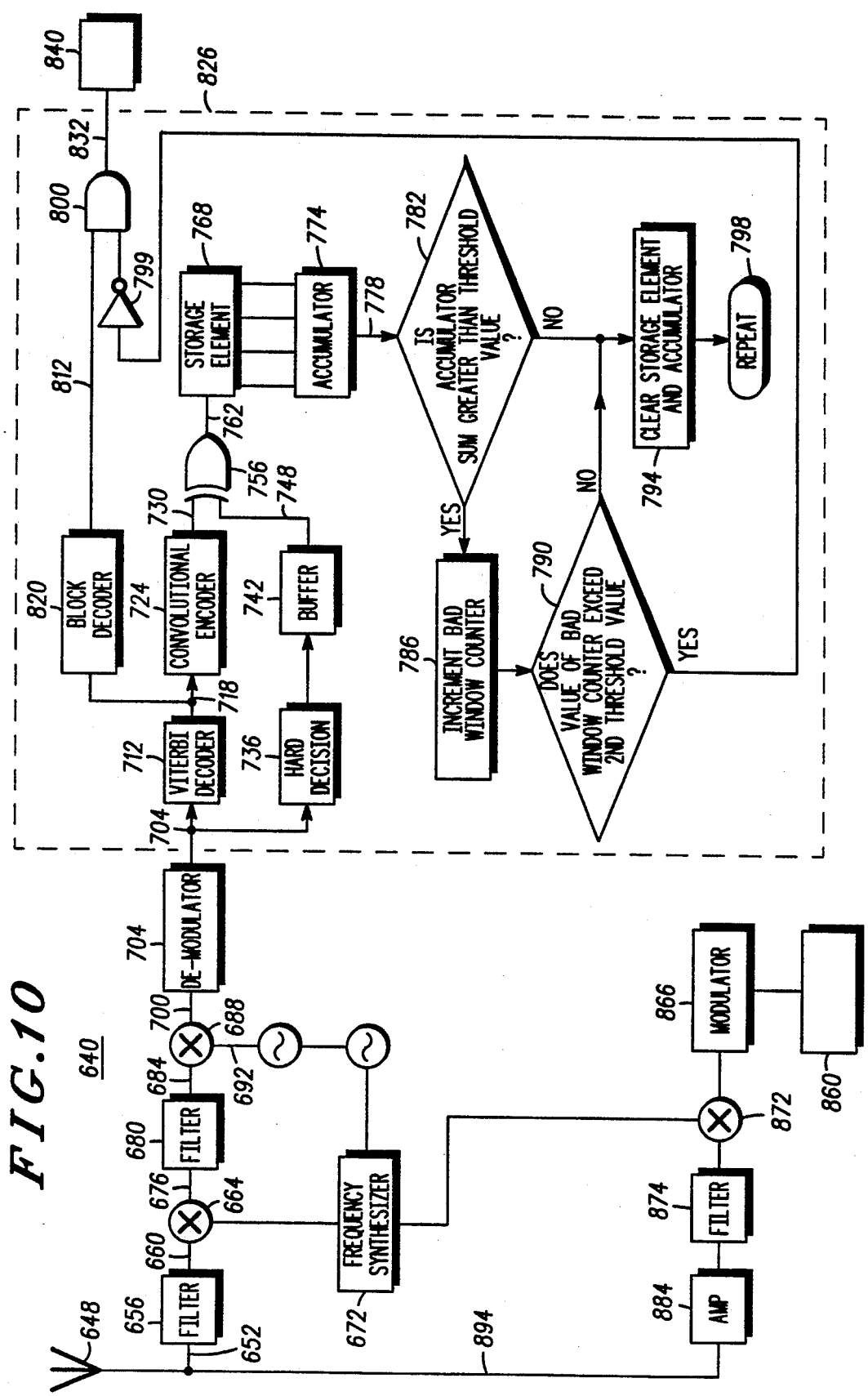
FIG. 10 is a partial block, partial flow diagram of a radiotelephone constructed according to the teachings of a preferred embodiment of the present invention in which the error detection system of FIG. 5 forms a portion thereof.

Turning now to the block diagram of FIG. 10, a transceiver, referred to generally by reference numeral 640, which incorporates the error detection system of the present invention is shown. A signal transmitted over a transmission channel is received by antenna 648, and an electrical signal indicative of the received signal is transmitted on line 652 to filter 656. Filter 656 generates a filtered signal on line 660 which is supplied to mixer 664. Mixer 664 receives an oscillating signal on line 668 from frequency synthesizer 672 to down convert in frequency the signal, and to generate a down-converted signal on line 676.

Line 676 is coupled to filter 680 which generates a filtered signal on line 684 which is supplied to second mixer 688. Second mixer 688 receives an oscillating signal on line 692 generated by oscillator 694. (As illustrated, reference oscillator 695 is connected to oscillator 692 on line 696, and, additionally, to frequency synthesizer 672 on line 698, to provide reference frequency signals thereto.) Mixer 688 generates a second, down-converted signal on line 700 which is supplied to demodulator 704. Demodulator 704 generates a demodulated signal on line 708 which is supplied to Viterbi decoder 712.

The demodulated signal generated by demodulator 704 is an analog signal which may be utilized by Viterbi decoder 712 as a soft decision signal to permit better decoding of the signal supplied to the decoder 712.

Viterbi decoder 712 corresponds to the Viterbi decoder 312 of FIG. 5. As described more fully in connection with error detection system 300 of FIG. 5, Viterbi decoder 712 generates a decoded signal on line 418 which is supplied to convolutional encoder 724. Convolutional encoder 724 generates a re-encoded signal on line 730.

The signal generated on line 706 is also supplied to hard decision block 736 which converts the signals supplied thereto on line 706 into a series of binary sequences which are stored in buffer 742. The binary sequences are supplied on line 748 to exclusive-OR logic gate 756. The reencoded signal generated on line 730 is additionally supplied to gate 756. Gate 756 generates a comparison signal on line 762 which is supplied to storage element 768. As described with respect to system 300 of FIG. 5, portions (i.e., windows of signal bits) of the frame comprised of the comparison signal generated on line 762 are analyzed. Accumulator 744, line 778. logic blocks 782, 786, 790, 794, and 798 are similar in function with elements 374, 378, 382, 386, 390, 394, and 398 of FIG. 5, and operation of such elements will not again be discussed in detail. In any event, though, when an excessive number of dissimilar bits are detected within more than an allowable number of windows of the frame, decision block 790 generates a signal on line 796 indicative of a bad frame. Such a signal passes through inverter 799 and is supplied to AND gate 800.

The decoded signal decoded by Viterbi decoder 712 is additionally supplied to gate 800 on line 812 by way of block decoder 820. Block decoder 820 generates a signal on line 812 only when decoder 820 detects a proper sequence of parity bits, described hereinabove with respect to FIGS. 2-I through 2-III. Elements 712-820 are preferably embodied by an algorithm embodied within a digital processor, as indicated by block 826, shown in hatch.

An output of gate 800 is provided on line 832 to speech/source decoder 840 only during times in which no bad frame indicator is generated on line 796, and block decoder 820 detects the proper sequence of parity bits. Decoder 840 may additionally comprise a transducer such as a speaker.

The block diagram of FIG. 10 further illustrates a transmit portion of radiotelephone 640 comprising speech/source encoder 860 (which may additionally comprise a transducer such as a microphone), modulator 866, mixer 872, filter 878 and amplifier 884. An amplified signal generated by amplifier 884 is applied to antenna 648 on line 894 to permit transmission therefrom.

Figure 11:
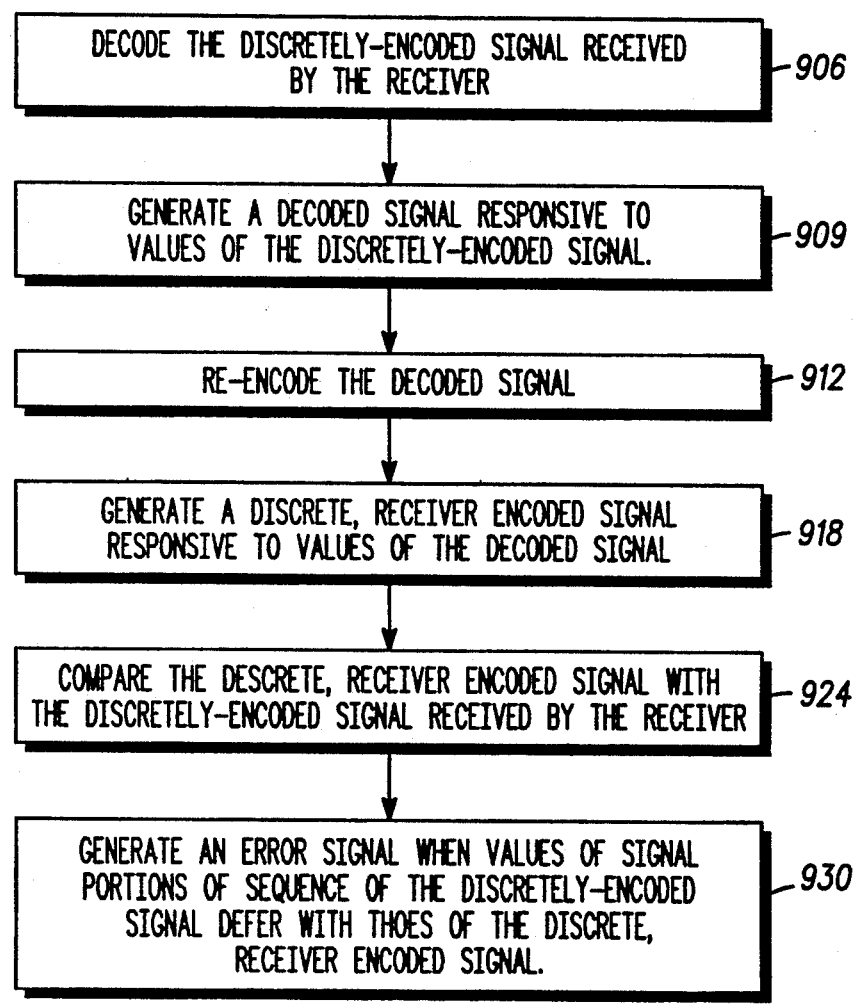
FIG. 11 is a logical flow diagram illustrating the steps of the method of a preferred embodiment of the present invention.

Turning now to the logical flow diagram of FIG. 11, the method steps of the method of the present invention, represented generally by reference numeral 900, for detecting when a sequence of a discretely-encoded signal received by a receiver is comprised of an excessive number of invalid signal portions. First, and as indicated by block 906, the discretely-encoded signal received by the receiver is decoded. Next, and as indicated by block 909, a decoded signal is generated responsive to values of the discretely-encoded signal. Next, and as indicated by block 912, the decoded signal is re-encoded. Next, and as indicated by block 918, a discrete, receiver-encoded signal is generated responsive to values of the decoded signal. Next, and as indicated by block 924, the discrete, receiver encoded signal is compared with the discretely-encoded signal received by the receiver. Finally, and as indicated by block 930, an error signal is generated responsive to times in which excessive numbers of values of signal portions of a sequence of the hard decision signal differ with values of signal portions of a corresponding sequence of the discrete, receiver-encoded signal.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. An error detection system for a receiver constructed to receive a discretely-encoded signal comprised of discretely-encoded signal-sequences, each of the discretely-encoded signal-sequences formed of signal portions, said error detection system operative to detect when a discretely-encoded signal-sequence of the discretely-encoded signal received by the receiver is comprised of excessive numbers of invalid signal portions, said error detection system comprising:

means for generating a soft decision signal comprised of soft decision signal-sequences representative of the discretely-encoded signal sequences of the discretely-encoded signal received by the receiver;

means forming a decoder for decoding the soft decision signal-sequences of said soft-decision signal generated by said means for generating the soft decision signal, the decoder formed thereby for generating a decoded signal comprised of decoded signal-sequences responsive to values of the soft decision signal-sequences comprising the soft decision signal;

means forming a coder for re-encoding the decoded signal-sequences of the decoded signal generated by the decoder and for generating a discrete, receiver-encoded signal comprised of receiver-encoded signal sequences responsive to values of the decoded signal-sequences comprising the decoded signal;

means forming a hard decision converter for converting the soft decision signal-sequences of the soft decision signal representative of the discretely-encoded signal received by the receiver into a hard decision signal comprised of hard decision signal-sequences;

means forming a comparator for comparing the receiver-encoded signal sequences of the discrete, receiver-encoded signal generated by the coder with corresponding hard decision signal-sequences of the hard decision signal and for generating a comparison signal indicative of comparisons therebetween; and means for generating an error signal responsive to times in which the comparison signal indicates that greater than a certain number of subsets of a hard decision signal-sequence of the hard decision signal include greater than a selected number of signal portion dissimilarities with corresponding signal portions of subsets of a receiver-encoded signal-sequence of the receiver-encoded signal wherein each of the subsets of the hard decision signal sequence and each of the subsets of the receiver-encoded signal-sequence is comprised of nonoverlapping groups of adjacently-positioned signal portions.

2. The error detection system of claim 1 further comprising means for associating a confidence level with comparisons generated by the comparator between the discrete, receiver-encoded signal and the hard decision signal.

3. The error detection system of claim 2 wherein said means for associating the confidence level comprises means for weighting signal portions of the comparison signal responsive to confidence levels associated therewith.

4. The error detection system of claim 1 wherein the decoder formed by the means for decoding comprises a Viterbi decoder.

5. The error detection system of claim 4 wherein the Viterbi decoder decodes the soft decision signal-sequences of the soft decision signal and generates the decoded signal sequences responsive thereto.

6. The error detection system of claim 1 wherein the coder formed by the means for re-encoding comprises a convolutional encoder.

7. The error detection system of claim 8 wherein the convolutional encoder encodes the decoded signal-sequences and generates the receiver-encoded signal-sequences responsive thereto.

8. The error detection system of claim 1 wherein said soft decision signal is comprised of a demodulated signal demodulated by the receiver.

9. The error detection system of claim 1 further comprising means forming a buffer for storing at least one hard decision signal-sequence of the hard decision signal formed by the hard decision converter.

10. The error detection system of claim 1 wherein the comparison signal generated by said means for comparing is comprised of signal portions of values representative of comparisons between signal portions of the receiver-encoded signal sequences of the discrete, receiver-encoded signal generated by the coder with corresponding signal portions of the hard decision signal-sequences of the hard decision signal formed by the hard decision converter.

11. The error detection system of claim 10 further comprising means for storing signal portions of said comparison signal generated by the means for comparing.

12. The error detection system of claim 11 further comprising means for associating a confidence level with comparisons generated by the comparator between the signal portions of the receiver-encoded signal-sequences of the discrete, receiver-encoded signal and the signal portions of the hard decision signal-sequences of the hard decision signal.

13. A bad frame indicator for a receiver constructed to receive a discretely-encoded signal comprised of coded frames of a pre-determined number of bits, said bad frame indicator operative to detect when the receiver receives an invalid frame, said bad frame comprising:

means for generating a soft-decision signal comprised of soft decision signal-frames representative of the coded frames of the discretely-encoded signal received by the receiver;

means forming a decoder for decoding the soft decision signal-frames of said soft-decision signal generated by said means for generating the soft-decision signal, the decoder formed thereby for generating a decoded signal comprised of decoded frames responsive to values of the soft decision frames of the soft-decision signal;

means forming a coder for re-encoding the decoded frames of the decoded signal generated by the decoder and for generating a discrete, receiver-encoded signal comprised of re-encoded frames responsive to values of signal portions of the decoded frames of the the decoded signal;

means forming a hard decision converter for converting the soft decision signal frames of the soft decision signal into a hard decision signal comprised of hard decision signal frames;

means forming a comparator for comparing the re-encoded frames of the discrete, receiver-encoded signal generated by the coder with the hard decision signal-frames of the hard decision signal and for generating a comparison signal indicative of comparisons therebetween; and means for generating an error signal responsive to times in which the comparison signal indicates that greater than a certain number of subsets of a hard decision signal-frame of the hard decision signal include greater than a selected number of bit dissimilarities with corresponding bits of subsets of a re-encoded frame wherein each of the subsets of the hard decision signal-frame and each of the subsets of the re-encoded frame is comprised of nonoverlapping groups of adjacently-positioned bits.

14. An error detection system for a receiver constructed to receive a discretely-encoded signal comprised of discretely-encoded signal-sequences, each of the discretely-encoded signal sequences formed of signal portions, said error detection system operative to detect when a discretely-encoded signal-sequence of the discretely-encoded signal received by the receiver is comprised of excessive numbers of invalid signal portions, said error detection system comprising:

means forming a Viterbi decoder for decoding the discretely-encoded signal sequences of said discretely-encoded signal received by the receiver and applied thereto, and for generating a decoded signal comprised of decoded signal-sequences responsive to values of the discretely-encoded signal-sequences of the discretely-encoded signal;

means forming a coder for re-encoding the decoded signal-sequences of the decoded signal generated by the Viterbi decoder and for generating a discrete, receiver-encoded signal comprised of receiver-encoded signal sequences responsive to values of the decoded signal-sequences of the decoded signal;

means forming a comparator for comparing the discrete, receiver-encoded signal generated by the coder with corresponding discretely-encoded signal-sequences of the discretely-encoded signal received by the receiver and for generating a comparison signal indicative of comparisons therebetween; and means for generating an error signal responsive to times in which the comparison signal indicates that greater than a certain number of subsets of a receiver-encoded signal-sequence of the receiver-encoded signal include greater than a selected number of signal portion dissimilarities with corresponding signal portions of subsets of a discretely-encoded signal sequence of the discretely-encoded signal, wherein each of the subsets of the receiver-encoded signal-sequence and each of the subsets of the receiver-encoded signal-sequence is comprised of nonoverlapping groups of adjacently-positioned signal portions.

15. An error detection system for a receiver constructed to receive a discretely-encoded signal comprised of discretely-encoded signal-sequences, each of the discretely-encoded signal sequences formed of signal portions, said error detection system operative to detect when a discretely-encoded signal-sequence of the discretely-encoded signal received by the receiver is comprised of excessive numbers of invalid signal portions, said error detection system comprising:

means forming a decoder for decoding discretely-encoded signal-sequences of said discretely-encoded signal received by the receiver and applied thereto, and for generating a decoded signal comprised of decoded signal-sequences responsive to values of the discretely-encoded signal-sequences of the discretely-encoded signal;

means forming a convolutional coder for re-encoding the decoded signal-sequences of the decoded signal generated by the decoder and for generating a discrete, receiver-encoded signal comprised of receiver-encoded signal sequences responsive to values of the decoded signal-sequences of the decoded signal;

means forming a comparator for comparing the receiver-encoded signal-sequences of the discrete, receiver-encoded signal generated by the convolutional coder with the discretely-encoded signal-sequences of the discretely-encoded signal received by the receiver and for generating a comparison signal indicative of comparisons therebetween; and means for generating an error signal responsive to times in which the comparison signal indicates that greater than a certain number of subsets of a receiver-encoded signal-sequence of the receiver-encoded signal include greater than a selected number of signal portion dissimilarities with corresponding signal portions of subsets of a discretely-encoded signal sequence of the discretely-encoded signal-sequence of the discretely-encoded signal, wherein each of the subsets of the receiver-encoded signal-sequence and each of the subsets of the receiver-encoded signal-sequence is comprised of nonoverlapping groups of adjacently-positioned signal portions.

16. In a radio transceiver having receiver circuitry and transmitter circuitry, the receiver circuitry operative to receive a discretely-encoded signal comprised of coded frames of a pre-determined number of bits, the combination with the receiver circuitry of a bad frame indicator for detecting when the receiver receives an invalid frame, said bad frame indicator comprising:

means for generating a soft-decision signal comprised of soft decision signal-frames representative of the coded frames of the discretely-encoded signal received by the receiver;

means forming a decoder for decoding the soft decision signal-frames of said soft-decision signal representative of the coded frames of the discretely-encoded signal generated by said means for generating the soft-decision signal and for generating a decoded signal comprised of decoded frames responsive to values of the soft decision signal-frames of the soft-decision signal;

means forming a coder for re-encoding the decoded frames of the decoded signal generated by the decoder and for generating a discrete, receiver-encoded signal comprised of re-encoded frames responsive to values of the decoded frames of the decoded signal;

means forming a hard decision converter for converting the soft decision signal-frames of the soft decision signal representative of the coded frames of the discretely-encoded signal received by the receiver into a hard decision signal comprised of hard decision signal-frames;

means forming a comparator for comparing the coded frames of the discrete, receiver-encoded signal generated by the coder with hard decision signal-frames of the hard decision signal and for generating a comparison signal indicative of comparisons therebetween; and means for generating an error signal responsive to times in which the comparison signal indicates that greater than a certain number of subsets of a coded frame of the discrete, receiver-encoded signal includes greater than a selected number of bit dissimilarities with corresponding bits of subsets of a hard decision signal-frame of the hard decision signal, wherein each of the subsets of the coded frame and each of the subsets of the hard decision signal frame is comprised of nonoverlapping groups of adjacently-positioned bits.

17. A method for detecting when a sequence of a discretely-encoded signal received by a receiver, constructed to receive discretely-encoded signals comprised of discretely-encoded signal sequences formed of signal portions, is comprised of excessive numbers of invalid signal portions, said method comprising the steps of:

generating a soft-decision signal comprised of soft decision signal-sequences representative of the discretely-encoded signal-sequences of the discretely-encoded signal received by the receiver;

decoding the soft decision signal-sequences of said soft-decision signal received by the receiver;

generating a decoded signal comprised of decoded signal-sequences responsive to values of the soft decision signal-sequences comprising the soft decision signal;

re-encoding the decoded signal-sequences of the decoded signal;

generating a discrete, receiver-encoded signal comprised of receiver-encoded signal sequences responsive to values of the decoded signal-sequences comprising the decoded signal;

converting the soft decision signal-sequences of the soft-decision signal received by the receiver into a hard decision signal comprised of hard decision signal-sequences;

comparing the receiver-encoded signal sequences of the discrete, receiver encoded signal with corresponding hard decision signal-sequences of the hard decision signal and generating a comparison signal indicative of comparisons therebetween; and generating an error signal responsive to times in which the comparison signal indicates that greater than a certain number of subsets of a hard decision signal-sequence of the hard decision signal include greater than a selected number of signal portion dissimilarities with corresponding signal portions of subsets of a receiver-encoded signal-sequence of the receiver-encoded signal wherein each of the subsets of the hard decision signal sequence and each of the subsets of the receiver-encoded signal-sequence is comprised of nonoverlapping groups of adjacently-positioned signal portions.

* * * * *